US012658228B2

(12) United States Patent
Kang et al.

(10) Patent No.: US 12,658,228 B2
(45) Date of Patent: Jun. 16, 2026

(54) MEMORY DEVICE INCLUDING MEMORY PACKAGE AND MEMORY SYSTEM INCLUDING THE MEMORY DEVICE

(71) Applicant: SK hynix Inc., Gyeonggi-do (KR)

(72) Inventors: Sung Geun Kang, Gyeonggi-do (KR); In Bo Shim, Gyeonggi-do (KR); Su Il Jin, Gyeonggi-do (KR); Eun Kyu Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 155 days.

(21) Appl. No.: 18/328,781

(22) Filed: Jun. 5, 2023

(65) Prior Publication Data

US 2024/0194233 A1 Jun. 13, 2024

(30) Foreign Application Priority Data

Dec. 8, 2022 (KR) ........................ 10-2022-0170793

(51) Int. Cl.
*G11C 7/22* (2006.01)
*G11C 7/10* (2006.01)

(52) U.S. Cl.
CPC ............ *G11C 7/222* (2013.01); *G11C 7/1093* (2013.01); *G11C 7/1096* (2013.01)

(58) Field of Classification Search
CPC ..... G11C 7/222; G11C 7/1093; G11C 7/1096; G11C 7/1042; G11C 16/0483; G11C 16/10; G11C 16/32; G11C 7/1078; G11C 8/12; G06F 3/0658
See application file for complete search history.

(56) References Cited

U.S. PATENT DOCUMENTS

| | | | |
|---|---|---|---|
| 2005/0144516 A1* | 6/2005 | Gonzalez ............ G06F 12/0246 714/6.13 |
| 2006/0112239 A1 | 5/2006 | Ruckerbauer |
| 2010/0079216 A1 | 4/2010 | Sakano |

(Continued)

FOREIGN PATENT DOCUMENTS

| | | |
|---|---|---|
| CN | 1804815 A | 7/2006 |
| CN | 1012666482 A | 9/2008 |

(Continued)

OTHER PUBLICATIONS

Samie B. Samaan et al., High-speed Serial Bus Repeater Primer Re-driver and Re-timer Micro-architecture, Properties, and Usage, White Paper, Oct. 2015, pp. 1-72, Revision 1.2, Intel Corporation.

(Continued)

*Primary Examiner* — Amir Zarabian
*Assistant Examiner* — Bradley S Coon
(74) *Attorney, Agent, or Firm* — IP & T GROUP LLP

(57) ABSTRACT

A memory system includes a memory device and a memory controller for providing data to the memory device based on a clock signal. The memory device includes a first memory group; a second memory group; an internal clock generator for generating a first internal clock signal and a second internal clock signal, which respectively correspond to a first period and a second period of the clock signal; and a data distributor for providing the data respectively to the first memory group and the second memory group, based on the first internal clock signal and the second internal clock signal.

17 Claims, 10 Drawing Sheets

(56) References Cited

U.S. PATENT DOCUMENTS

| | | | |
|---|---|---|---|
| 2016/0077968 A1* | 3/2016 | Sela | G06F 12/0246 |
| | | | 711/118 |
| 2017/0076797 A1* | 3/2017 | Lung | G11C 7/1072 |
| 2021/0132798 A1 | 5/2021 | McGlaughlin | |
| 2021/0225426 A1* | 7/2021 | Moon | G11C 7/1066 |
| 2022/0066962 A1* | 3/2022 | Ning | G11C 11/4063 |
| 2022/0172767 A1* | 6/2022 | Yu | G11C 11/4074 |
| 2022/0357822 A1 | 11/2022 | He et al. | |

FOREIGN PATENT DOCUMENTS

| | | | |
|---|---|---|---|
| CN | 110648698 A | 1/2020 | |
| DE | 102005051945 A1 | 6/2006 | |
| EP | 2060976 A1 | 5/2009 | |
| KR | 10-2002-0042145 A | 6/2002 | |
| KR | 10-2010-0072068 A | 6/2010 | |
| KR | 10-1476463 B1 | 12/2014 | |
| KR | 10-2020-0036700 A | 4/2020 | |
| KR | 10-2020-0056881 A | 5/2020 | |
| KR | 10-2021-0095009 A | 7/2021 | |

OTHER PUBLICATIONS

Office Action for the U.S. Appl. No. 17/736,815 issued by the USPTO on Aug. 22, 2023.

Office Action for Korean Patent Application No. 10-2021-0173983 issued by the Korean Patent Office on Oct. 22, 2025.

Office Action for Korean Patent Application No. 10-2022-0170793 issued by the Korean Patent Office on Mar. 4, 2026.

Office Action for Chinese Patent Application 202211258554.2 issued by the Chinese Patent Office on Mar. 31, 2026.

* cited by examiner

MEMORY DEVICE INCLUDING MEMORY PACKAGE AND MEMORY SYSTEM INCLUDING THE MEMORY DEVICE

CROSS-REFERENCE TO RELATED APPLICATION

The present application claims priority under 35 U.S.C. § 119(a) to Korean patent application number 10-2022-0170793 filed on Dec. 8, 2022, the entire disclosure of which is incorporated by reference herein.

BACKGROUND

1. Field of Invention

Embodiments of the present disclosure generally relate to an electronic device, and more particularly, to a memory device including a memory package and a memory system including the memory device.

2. Description of Related Art

A memory system is a device which stores data under the control of a host device such as a computer or a smart phone. The memory system may include a memory device for storing data and a memory controller for controlling the memory device. The memory device is classified into a volatile memory device and a nonvolatile memory device.

The memory device may receive data from the memory controller through a plurality of channels. In order to increase the processing speed of the data received from the memory controller, the memory device may perform an interleaving operation in which a plurality of memory dies connected to one channel overlappingly process the data. However, as the number of memory dies sharing one channel becomes larger, the speed at which data is transferred to each of the memory dies may become slower due to resistance or the like. In order to increase the speed at which memory dies sharing one channel process data, a plurality of clock signals may be used such that each of the memory dies can process data.

SUMMARY

Various embodiments of the present disclosure provide a memory device including a memory package and a memory system including the memory device, which can increase the speed at which data received from the outside is processed.

In accordance with an embodiment of the present disclosure, there is provided a memory system including: a memory device; and a memory controller configured to provide data to the memory device based on a clock signal, wherein the memory device includes: a first memory group; a second memory group; an internal clock generator configured to generate a first internal clock signal and a second internal clock signal, which respectively correspond to a first period and a second period of the clock signal; and a data distributor configured to provide the data respectively to the first memory group and the second memory group, based on the first internal clock signal and the second internal clock signal.

In accordance with another embodiment of the present disclosure, there is provided a memory system including: a memory device; and a memory controller configured to provide data to the memory device, based on a clock signal, wherein the memory device includes: first to nth memory groups each including a plurality of memory dies; an internal clock generator configured to generate first to nth internal clock signals respectively corresponding to the first to nth memory groups, based on the clock signal; and a data distributor configured to provide the data to the first to nth memory groups, respectively, based on the first to nth internal clock signals.

In accordance with another embodiment of the present disclosure, there is provided a memory package including: first to nth memory groups each including a plurality of memory dies; an internal clock generator configured to generate first to nth internal clock signals, provide the first to nth internal clock signals to the first to nth memory groups, respectively, based on a clock signal; and a data distributor configured to receive data, and distribute the data to the first to nth memory groups according to the clock signal, respectively, based on the first to nth internal clock signals.

In accordance with another embodiment of the present disclosure, there is provided a memory system including: a memory controller configured to provide a plurality of data items and a clock signal, the plurality of data items including multiple odd data items and multiple even data items; and a memory device including a plurality of memory packages coupled to the memory controller through a plurality of channels, respectively. Each of the memory packages includes first and second memory groups, each memory group including a plurality of memory dies; and an interface. The interface includes an internal clock generator configured to generate first and second internal clock signals based on the clock signal, alternatively; and a data distributor configured to sequentially provide the multiple odd data items to the first memory groups in response to the first internal clock signal, and sequentially provide the multiple even data items to the second memory groups in response to the second internal clock signal.

In accordance with another embodiment of the present disclosure, there is provided a method of operating a memory device including: receiving data from a memory controller based on a clock signal; generating a first internal clock signal corresponding to an odd period of the clock signal and a second internal clock signal corresponding to an even period of the clock signal; and distributing the data to a first memory group and a second memory group included in the memory device, based on the first internal clock signal and the second internal clock signal, respectively.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
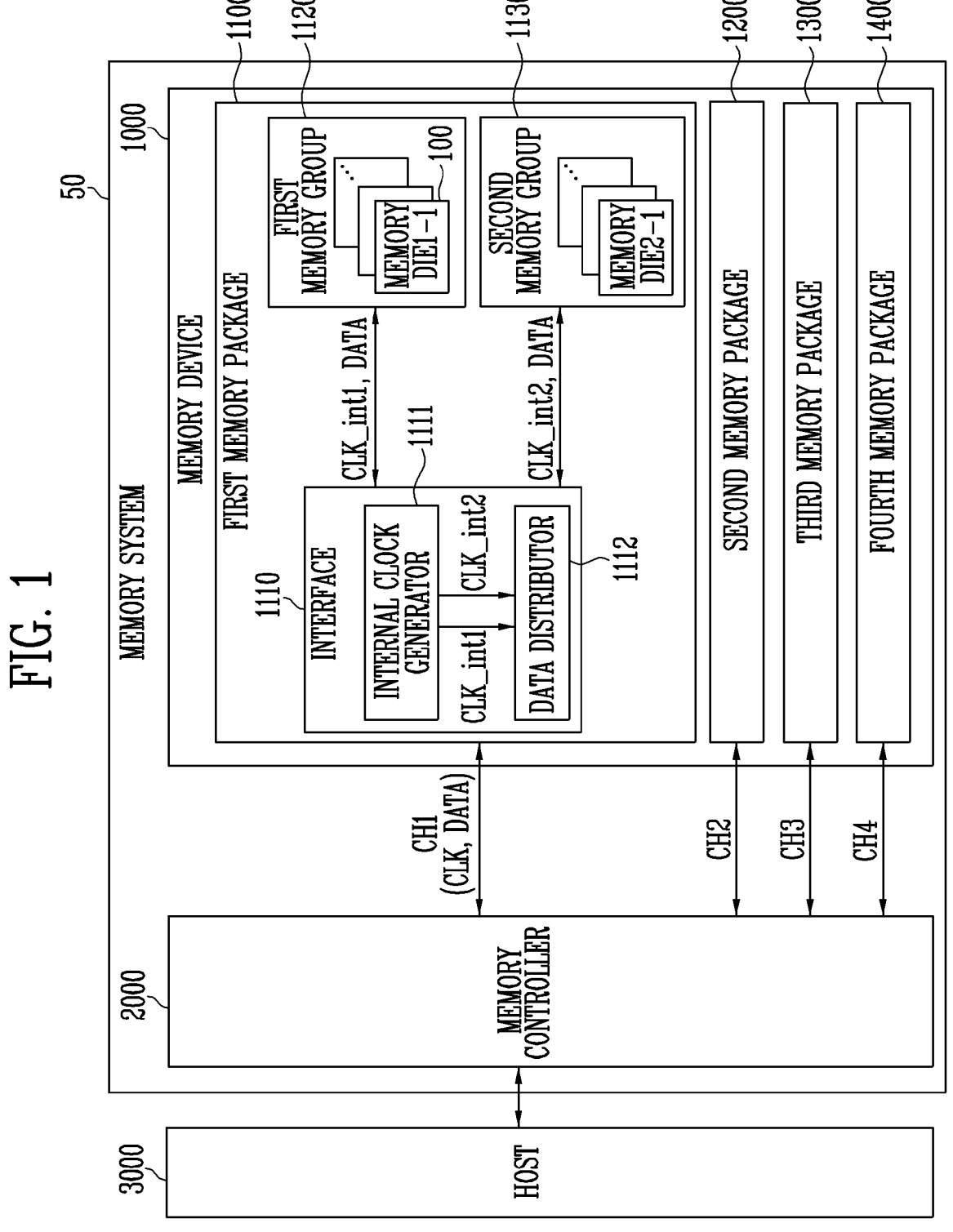
FIG. 1 is a diagram illustrating a memory system including a memory device in accordance with an embodiment of the present disclosure.

FIG. 1 is a diagram illustrating a memory system 50 including a memory device in accordance with an embodiment of the present disclosure.

Referring to FIG. 1, the memory system 50 may include a memory device 1000 and a memory controller 2000. The memory system 50 may store data under the control of a host 3000 located at the outside. The memory system 50 may be a storage device included in a mobile phone, a computer, an in-vehicle infotainment, or the like. The memory system 50 may be manufactured as any of various types of storage devices such as a Solid State Drive (SSD) according to a host interface as a communication scheme with the host 3000. The memory system 50 may be manufactured as any of various package types, such as a Package On Package (POP) and a System On Chip (SOC).

The memory device 1000 may store data. The memory device 1000 may be operated under the control of the memory controller 2000. In an embodiment, the memory device 1000 may be a volatile memory device or a nonvolatile memory device.

The memory device 1000 may receive a command and an address from the memory controller 2000, and access an area selected by the address. The memory device 1000 may perform an operation instructed by the command on the area selected by the address. The memory device 1000 may perform a program operation (write operation) of storing data in the area selected by the address, a read operation of reading data, or an erase operation of erasing data.

The memory controller 2000 may control overall operations of the memory system 50.

When power is applied to the memory system 50, the memory controller 2000 may execute firmware (FW). In an embodiment, the memory controller 2000 may control communication between the host 3000 and the memory device 1000 by executing the FW. In an embodiment, the memory controller 2000 may translate a logical address of the host 3000 into a physical address of the memory device 1000.

The memory controller 2000 may control the memory device 1000 to perform a write operation, a read operation, an erase operation, or the like in response to a request from the host 3000. The memory controller 2000 may provide the memory device 1000 with a command, a physical address, or data according to the write operation, the read operation, or the erase operation.

In an embodiment, the memory controller 2000 may autonomously generate a command, an address, and data, regardless of any request from the host 3000, and transmit the command, the address, and the data to the memory device 1000. For example, the memory controller 2000 may provide the memory device 1000 with a command, an address, and data, which are used to perform read and write operations accompanied in performing wear leveling, read reclaim, garbage collection, and the like.

The host 3000 may communicate with the memory system 50 by using at least one of various communication schemes such as NonVolatile Memory express (NVMe) and Universal Flash Storage (UFS).

In an embodiment, the memory device 1000 may include a plurality of memory packages. For example, as shown in FIG. 1, the memory device 1000 may include first to fourth memory packages 1100 to 1400. The memory packages may communicate with the memory controller 2000 respectively through different channels. For example, the first memory package 1100 may communicate with the memory controller 2000 through a first channel CH1. Although a case where one memory package is connected to one channel is illustrated in FIG. 1, a plurality of memory packages may be connected to one channel.

In an embodiment, the first memory package 1100 may include interface 1110 and a plurality of memory groups. In the illustrated example of FIG. 1, the first memory package 1100 may include a first memory group 1120 and a second memory group 1130. Each of the first memory group 1120 and the second memory group 1130 may include a plurality of memory dies.

Each of the plurality of memory dies may perform a program operation, a read operation, or an erase operation according to a command, an address or data, received from the memory controller 2000. In an embodiment, each of the plurality of memory dies may include a plurality of planes. Each of the plurality of planes may include a plurality of memory blocks.

In an embodiment, the interface 1110 may receive a clock signal CLK and data DATA through the first channel CH1. The data DATA may be received from the memory controller 2000, based on the clock signal CLK. For example, the interface 1110 may receive the data DATA according to a rising edge or a falling edge of the clock signal CLK. In an embodiment, the clock signal CLK may be a data strobe signal DQS or a write enable signal.

In an embodiment, the interface 1110 may include an internal clock generator 1111 and a data distributor 1112.

The internal clock generator 1111 may generate a first internal clock signal CLK_int1 and a second internal clock signal CLK_int2, based on the clock signal CLK received from the memory controller 2000. The first internal clock signal CLK_int1 may be a clock signal to be provided to the first memory group 1120. The second internal clock signal CLK_int2 may be a clock signal to be provided to the second memory group 1130. The internal clock generator 1111 may provide the data distributor 1112 with the first internal clock signal CLK_int1 and the second internal clock signal CLK_int2.

The data distributor 1112 may distribute data received from the memory controller 2000 to the first memory group 1120 and the second memory group 1130, based on the first internal clock signal CLK_int1 and the second internal clock signal CLK_int2. Specifically, the data distributor 1112 may provide data to the first memory group 1120, based on the first internal clock signal CLK_int1, and provide data to the second memory group 1130, based on the second internal clock signal CLK_int2. For example, when first data and second data are sequentially received from the memory controller 2000, the data distributor 1112 may provide the first data to the first memory group 1120 according to the first internal clock signal CLK_int1, and provide the second data to the second memory group 1130 according to the second internal clock signal CLK_int2. That is, the data distributor 1112 may provide, in parallel, data to the first memory group 1120 and the second memory group 1130 by using the first internal clock signal CLK_int1 and the second internal clock signal CLK_int2. The data received from the memory controller 2000 through the first channel CH1 may be provided respectively to the first memory group 1120 and the second memory group 1130 according to the first internal clock signal CLK_int1 and the second internal clock signal CLK_int2.

In an embodiment, like the first memory package 1100, each of the second to fourth memory packages 1200 to 1400 may include an interface 1110, a first memory group 1120, and a second memory group 1130.

A speed at which data is received from the memory controller 2000, based on the clock signal CLK, may be faster than a speed at which data is provided to the first memory group 1120 or the second memory group 1130, based on an internal clock signal. In order to prevent occurrence of a bottleneck phenomenon of data processing as the speed at which data is provided to the first memory group 1120 or the second memory group 1130 is slower than the speed at which data is received from the memory controller 2000, the interface 1110 may provide, in parallel, data to the first memory group 1120 and the second memory group 1130 by using the first internal clock signal CLK_int1 and the second internal clock signal CLK_int2.

Figure 2:
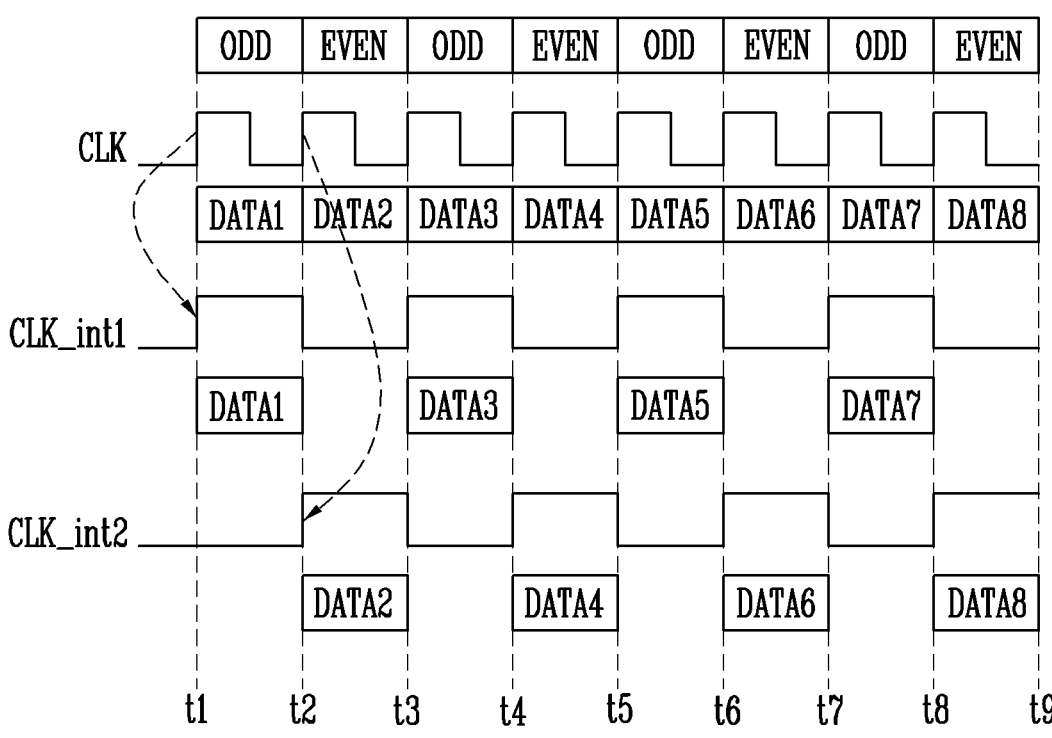
FIG. 2 is a timing diagram illustrating an operation of processing data according to internal clock signals generated based on a clock signal in accordance with an embodiment of the present disclosure.

FIG. 2 is a timing diagram illustrating an operation of processing data according to internal clock signals generated based on the clock signal in accordance with an embodiment of the present disclosure.

FIG. 2 will be described with reference to FIG. 1. Referring to FIG. 2, the interface 1110 may receive data DATA1 to DATA8 from the memory controller 2000, based on the clock signal CLK. The clock signal CLK may include a first period and a second period. The first period may be an odd period ODD, and the second period may be an even period EVEN. The clock signal CLK may include odd period ODD and even period EVEN which are alternately repeated.

Specifically, a period from t1 to t2 may be an odd period ODD. In the period from t1 to t2, the interface 1110 may receive first data DATA1, based on the clock signal CLK.

During the period from t1 to t2, the internal clock generator 1111 may generate the first internal clock signal CLK_int1 in response to a rising edge of the clock signal CLK. In an embodiment, the first internal clock signal CLK_int1 may be changed from a logic low level to a logic high level in synchronization with a rising edge of the clock signal CLK during an odd period of the clock signal. The first internal clock signal CLK_int1 may be a clock signal provided to the first memory group 1120. During the period from t1 to t2, the data distributor 1112 may provide the first data DATA1 to the first memory group 1120, based on the first internal clock signal CLK_int1.

A period from t2 to t3 may be an even period EVEN. During the period from t2 to t3, the interface 1110 may receive second data DATA2, based on the clock signal CLK. During the period from t2 to t3, the internal clock generator 1111 may generate the second internal clock signal CLK_int2 in response to a rising edge of the clock signal CLK. In an embodiment, the second internal clock signal CLK_int2 may be changed from a logic low level to a logic high level in synchronization with a rising edge of the clock signal CLK during an even period of the clock signal. The second internal clock signal CLK_int2 may be a clock signal provided to the second memory group 1130. During the period from t2 to t3, the data distributor 1112 may provide the second data DATA2 to the second memory group 1130, based on the second internal clock signal CLK_int2. During the period from t2 to t3, the first internal clock signal CLK_int1 may be changed from a logic high level to a logic low level.

A period from t3 to t4 may be an odd period ODD. During the period from t3 to t4, the interface 1110 may receive third data DATA3, based on the clock signal CLK. During the period from t3 to t4, the first internal clock signal CLK_int1 may be changed from a logic low level to a logic high level in response to a rising edge of the clock signal CLK during the odd period. During the period from t3 to t4, the data distributor 1112 may provide the third data DATA3 to the first memory group 1120, based on the first internal clock signal CLK_int1. During the period from t3 to t4, the second internal clock signal CLK_int2 may be changed from a logic high level to logic low level.

A period from t4 to t5 may be an even period EVEN. During the period from t4 to t5, the interface 1110 may receive fourth data DATA4, based on the clock signal CLK. During the period from t4 to t5, the second internal clock signal CLK_int2 may be changed from a logic low level to a logic high level in response to a rising edge of the clock signal CLK during the even period. During the period from t4 to t5, the data distributor 1112 may provide the fourth data DATA4 to the second memory group 1130, based on the second internal clock signal CLK_int2.

A period from t5 to t6 may be an odd period ODD. During the period from t5 to t6, the interface 1110 may receive fifth data DATA5, based on the clock signal CLK. During the period from t5 to t6, the first internal clock signal CLK_int1 may be changed from a logic low level to a logic high level in response to a rising edge of the clock signal CLK during the odd period. During the period from t5 to t6, the data distributor 1112 may provide the fifth data DATA5 to the first memory group 1120, based on the first internal clock signal CLK_int1.

A period from t6 to t7 may be an even period EVEN. During the period from t6 to t7, the interface 1110 may receive sixth data DATA6, based on the clock signal CLK. During the period from t6 to t7, the second internal clock signal CLK_int2 may be changed from a logic low level to a logic high level in response to a rising edge of the clock signal CLK during the even period. During the period from t6 to t7, the data distributor 1112 may provide the sixth data DATA6 to the second memory group 1130, based on the second internal clock signal CLK_int2.

A period from t7 to t8 may be an odd period ODD. During the period from t7 to t8, the interface 1110 may receive seventh data DATA7, based on the clock signal CLK. During the period from t7 to t8, the first internal clock signal CLK_int1 may be changed from a logic low level to a logic high level in response to a rising edge of the clock signal CLK during the odd period. During the period from t7 to t8, the data distributor 1112 may provide the seventh data DATA7 to the first memory group 1120, based on the first internal clock signal CLK_int1.

A period from t8 to t9 may be an even period EVEN. In the period from t8 to t9, the interface 1110 may receive eighth data DATA8, based on the clock signal CLK. During the period from t8 to t9, the second internal clock signal CLK_int2 may be changed from a logic low level to a logic high level in response to a rising edge of the clock signal CLK during the even period. During the period from t8 to t9, the data distributor 1112 may provide the eighth data DATA8 to the second memory group 1130, based on the second internal clock signal CLK_int2.

In an embodiment, the interface 1110 may receive the first to eighth data DATA1 to DATA8 in response to a rising edge of the clock signal CLK. The internal clock generator 1111 may generate the first internal clock signal CLK_int1 in response to a rising edge of the clock signal during the odd period. The internal clock generator 1111 may generate the second internal clock signal CLK_int2 in response to a rising edge of the clock signal during the even period. The internal clock generator 1111 may generate the first internal clock signal CLK_int1 and the second internal clock signal CLK_int2, which respectively correspond to the odd and even periods of the clock signal.

The data distributor 1112 may distribute the first to eighth data DATA1 to DATA8 respectively to the first memory group 1120 and the second memory group 1130, based on the first internal clock signal CLK_int1 and the second internal clock signal CLK_int2. Specifically, the data distributor 1112 may provide the first data DATA1, third data DATA3, the fifth data DATA5, and the seventh data DATA7 to the first memory group 1120, based on the first internal clock signal CLK_int1. The data distributor 1112 may provide the second data DATA2, the fourth data DATA4, the sixth data DATA6, and the eighth data DATA8 to the second memory group 1130, based on the second internal clock signal CLK_int2.

Figure 3:
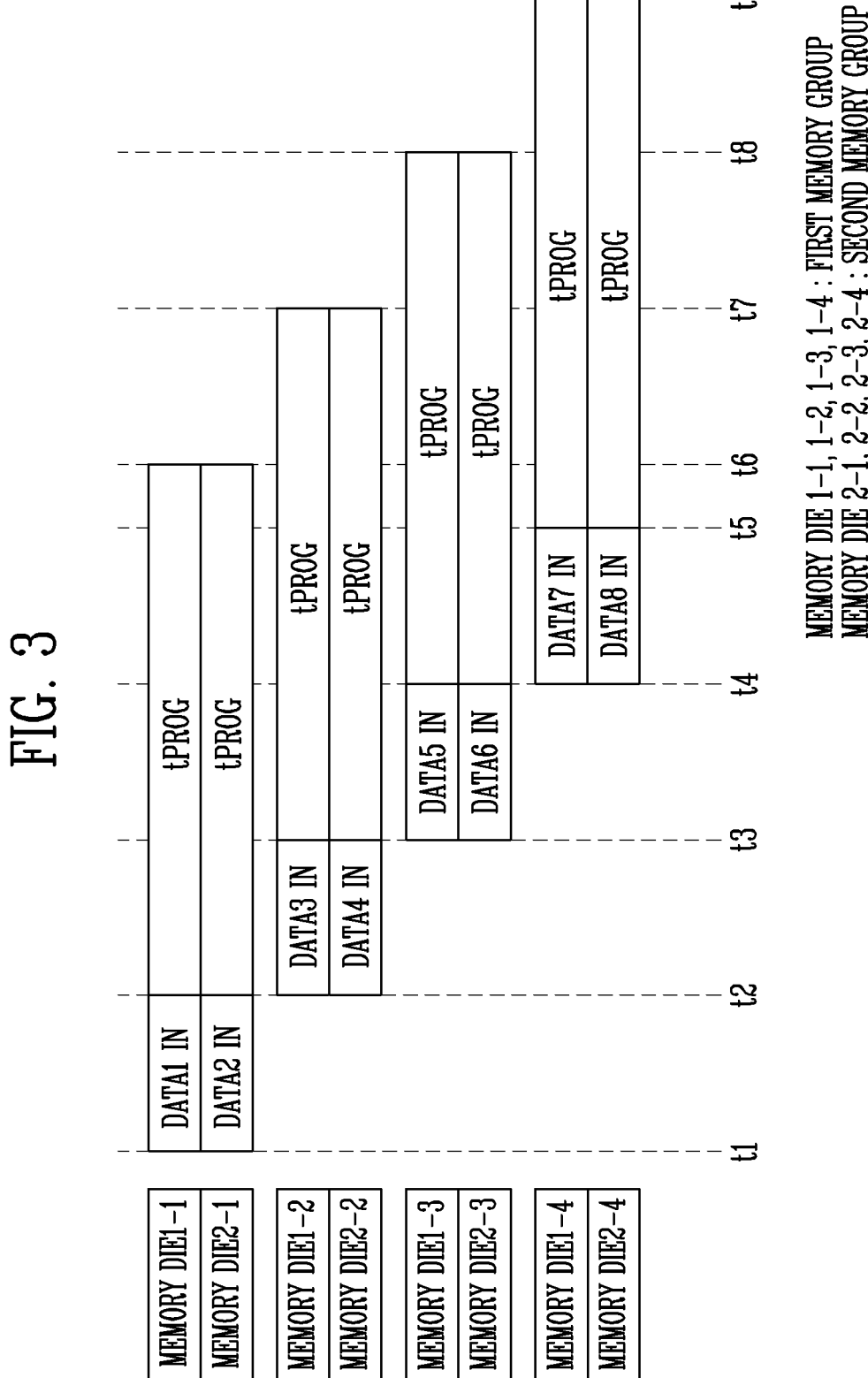
FIG. 3 is a timing diagram illustrating an interleaving operation of memory dies respectively included in memory groups in accordance with an embodiment of the present disclosure.

FIG. 3 is a timing diagram illustrating an interleaving operation of memory dies respectively included in memory groups in accordance with an embodiment of the present disclosure.

FIG. 3 is described with reference to FIGS. 1 and 2. Referring to FIG. 3, a (1-1)th memory die MEMORY DIE1-1, a (1-2)th memory die MEMORY DIE1-2, a (1-3)th memory die MEMORY DIE1-3, and a (1-4)th memory die MEMORY DIE1-4 may be memory dies included in the first memory group 1120. A (2-1)th memory die MEMORY DIE2-1, a (2-2)th memory die MEMORY DIE2-2, a (2-3)th memory die MEMORY DIE2-3, and a (2-4)th memory die MEMORY DIE2-4 may be memory dies included in the second memory die 1130.

During a period from t1 to t2, the (1-1)th memory die MEMORY DIE1-1 may receive the first data DATA1, based on the first internal clock signal. During the period from t1 to t2, the (2-1)th memory die MEMORY DIE2-1 may receive the second data DATA2, based on the second internal clock signal. That is, during the period from t1 to t2, the (1-1)th memory die MEMORY DIE1-1 and the (2-1)th memory die MEMORY DIE2-1 may receive, in parallel, the first data DATA1 and the second data DATA2, based on the first internal clock signal and the second internal clock signal. After that, during period from t2 to t6, the (1-1)th memory die MEMORY DIE1-1 and the (2-1)th memory die MEMORY DIE2-1 may perform, in parallel, program operations of respectively storing the first data DATA1 and the second data DATA2.

During period from t2 to t3, the (1-2)th memory die MEMORY DIE1-2 may receive the third data DATA3, based on the first internal clock signal. During the period from t2 to t3, the (2-2)th memory die MEMORY DIE2-2 may receive the fourth data DATA4, based on the second internal clock signal. During the period from t2 to t3, the (1-2)th memory die MEMORY DIE1-2 and the (2-2)th memory die MEMORY DIE2-2 may respectively receive the third data DATA3 and the fourth data DATA4. After that, during a period from t3 to t7, the (1-2)th memory die MEMORY DIE1-2 and the (2-2)th memory die MEMORY DIE2-2 may perform program operations of respectively storing the third data DATA3 and the fourth data DATA4.

During a period from t3 to t4, the (1-3)th memory die MEMORY DIE1-3 may receive the fifth data DATA5, based on the first internal clock signal. During the period from t3 to t4, the (2-3)th memory die MEMORY DIE2-3 may receive the sixth data DATA6, based on the second internal clock signal. During the period from t3 to t4, the (1-3)th memory die MEMORY DIE1-3 and the (2-3)th memory die MEMORY DIE2-3 may respectively receive the fifth data DATA5 and the sixth data DATA6, based on the first internal clock signal and the second internal clock signal. After that, during a period from t4 to t8, the (1-3)th memory die MEMORY DIE1-3 and the (2-3)th memory die MEMORY DIE2-3 may perform program operations of respectively storing the fifth data DATA5 and the sixth data DATA6.

During a period from t4 to t5, the (1-4)th memory die MEMORY DIE1-4 may receive the seventh data DATA7, based on the first internal clock signal. During the period from t4 to t5, the (2-4)th memory die MEMORY DIE2-4 may receive the eighth data DATA8, based on the second internal clock signal. During the period from t4 to t5, the (1-4)th memory die MEMORY DIE1-4 and the (2-4)th memory die MEMORY DIE2-4 may receive, in parallel, the seventh data DATA7 and the eighth data DATA8, based on the first internal clock signal and the second internal clock signal. After that, during period from t5 to t9, the (1-4)th memory die MEMORY DIE1-4 and the (2-4)th memory die MEMORY DIE2-4, which are included in different memory groups, may simultaneously perform program operations of respectively storing the seventh data DATA7 and the eighth data DATA8.

The first memory group including the (1-1)th memory die MEMORY DIE1-1, the (1-2)th memory die MEMORY DIE1-2, the (1-3)th memory die MEMORY DIE1-3, and the (1-4)th memory die MEMORY DIE1-4 and the second memory group including the (2-1)th memory die MEMORY DIE2-1, the (2-2)th memory die MEMORY DIE2-2, the (2-3)th memory die MEMORY DIE2-3, and the (2-4)th memory die MEMORY DIE2-4 may be memory groups included in the first memory package 1100. That is, since the first memory group and the second memory group are memory groups included in one memory package, the first memory group and the second memory group may receive data from the memory controller through one channel such as the first channel CH1 shown in FIG. 1. In addition, since the first data and the second data, which are received through one channel, are distributed, in parallel, to memory dies included in different memory groups, based on the first internal clock signal and the second internal clock signal, the memory dies included in the different memory groups may simultaneously perform a program operation.

On the other hand, in the case of a conventional interleaving operation, the (1-1)th memory die MEMORY DIE1-1 and the (2-1)th memory die MEMORY DIE2-1 are connected to one channel. Therefore, after the (1-1)th memory die MEMORY DIE1-1 receives the first data, the (2-1)th memory die MEMORY DIE2-1 may receive the second data. That is, the (2-1)th memory die MEMORY DIE2-1 cannot receive the second data DATA2 until the (1-1)th memory die MEMORY DIE1-1 receives the first data DATA1. Accordingly, a program operation on the (2-1)th memory die MEMORY DIE2-1 may be delayed. In the conventional interleaving operation, a time required to perform the program operation may become long, as compared with the embodiment of the present disclosure in which the first data DATA1 and the second data DATA2 are provided, in parallel, to the (1-1)th memory die MEMORY DIE1-1 and the (2-1)th memory die MEMORY DIE2-1, based on the first internal clock and the second internal clock.

Figure 4:
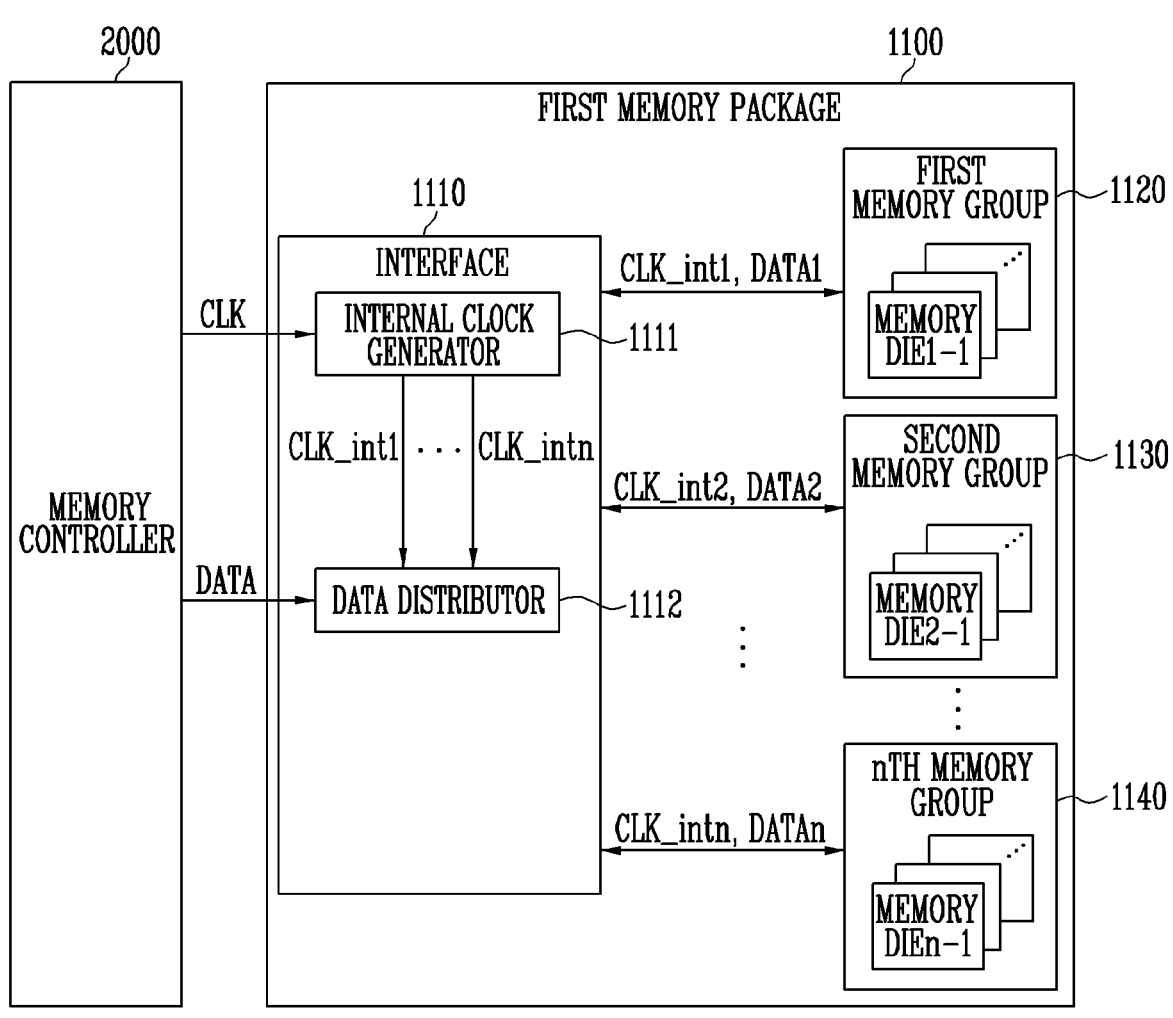
FIG. 4 is a diagram illustrating a memory package in accordance with an embodiment of the present disclosure.

FIG. 4 is a diagram illustrating a memory package in accordance with an embodiment of the present disclosure.

Referring to FIG. 4, a first memory package 1100 may include an interface 1110 and first to nth memory groups 1120 to 1140. Here, n may be a natural number of 3 or more. Each of the first to nth memory groups 1120 to 1140 may include a plurality of memory dies.

The interface 1110 may include an internal clock generator 1111 and a data distributor 1112.

The internal clock generator 1111 may receive a clock signal CLK from the memory controller 2000. The internal clock generator 1111 may generate internal first to nth clock signals CLK_int1 to CLK_intn, based on the clock signal CLK. Here, n may be a natural number of 3 or more. The first to nth clock signals CLK_int1 to CLK_intn may be clock signals respectively corresponding to the first to nth memory groups 1120 to 1140. For example, the first internal clock signal CLK_int1 may be a clock signal to be provided to the first memory group 1120, and the nth internal clock signal CLK_intn may be a clock signal to be provided to the nth memory group 1140. The internal clock generator 1111 may provide the first to nth clock signals CLK_int1 to CLK_intn to the data distributor 1112.

In an embodiment, internal clock signals may be generated such that a number of the internal clock signals corresponds to the number of memory groups included in the first memory package 1100. For example, when a plurality of memory dies are divided into first to fourth memory groups (n=4), the internal clock generator 111 may generate first to fourth internal clock signals, based on the clock signal CLK. In another example, when the first memory package 1110 includes first to sixth memory groups (n=6), the internal clock generator 111 may generate first to sixth internal clock signals, based on the clock signal CLK.

In another embodiment, internal clock signals may be generated such that a number of the internal clock signals corresponds to the number of plurality of memory dies included in the first memory package 1100. Each memory group may include one memory die.

The data distributor 1112 may receive data DATA from the memory controller 2000. The data DATA may be received from the memory controller 2000, based on the clock signal CLK. The data distributor 1112 may distribute data to be provided to the first to nth memory groups 1120 to 1140, based on the first to nth internal clock signals CLK_int1 to CLK_intn. The data distributor 1112 may provide the data respectively to the first to nth memory groups 1120 to 1140, based on the first to nth internal clock signals CLK_int1 to CLK_intn.

In an embodiment, the data distributor 1112 may receive first to 2nth data, based to the clock signal CLK. The data distributor 1112 may provide first to nth data respectively to the first to nth memory groups 1120 to 1140 and then provide (n+1)th to 2nth data respectively to the first to nth memory groups 1120 to 1140, based on the first to nth internal clock signals CLK_int1 to CLK_intn. The first to nth data may be provided, in parallel, to the first to nth memory groups 1120 to 1140, and the (n+1)th to 2nth data may be provided, in parallel, to the first to nth memory groups 1120 to 1140.

(1-1)th to (n–1)th memory dies respectively included in the first to nth memory groups 1120 to 1140 may receive the first to nth data, based on the first to nth internal clock signals CLK_int1 to CLK_intn, and then perform, in parallel, program operations of respectively storing the first to nth data. (1-2)th to (n–2)th memory dies included in the first to nth memory groups 1120 to 1140 may receive the (n+1)th to 2nth data, based on the first to nth internal clock signals CLK_int1 to CLK_intn, and then perform, in parallel, program operations of respectively storing the (n+1)th to 2nth data.

In an embodiment, the second to fourth memory packages 1200 to 1400 shown in FIG. 1 may be implemented identically to the first memory package 1100 of FIG. 4.

Figure 5:
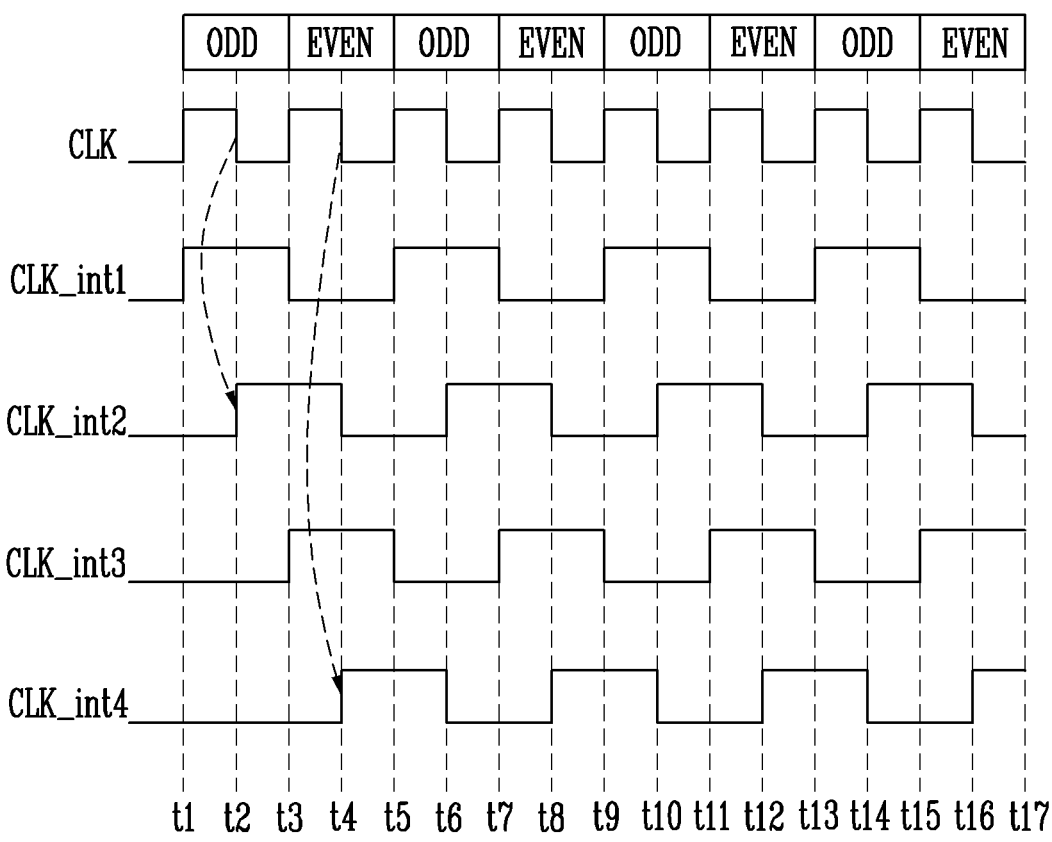
FIG. 5 is a timing diagram illustrating an operation of generating internal clock signals, based on a clock signal, in accordance with an embodiment of the present disclosure.

FIG. 5 is a timing diagram illustrating an operation of generating internal clock signals, based on a clock signal, in accordance with an embodiment of the present disclosure.

FIG. 5 is described with reference to FIG. 4. In FIG. 5, a case where the first memory package 1100 includes first to fourth memory groups (n=4) will be described as an example.

Referring to FIG. 5, the internal clock generator 1111 may generate first to fourth internal clock signals CLK_int1 to CLK_int4, based on the clock signal CLK received from the memory controller 2000. The first to fourth internal clock signals CLK_int1 to CLK_int4 may be clock signals to be respectively provided to first to fourth memory groups.

A period from t1 to t3 may be an odd period ODD. During the period from t1 to t2, the internal clock generator 1111 may generate the first internal clock signal CLK_int1 in response to a rising edge of the clock signal. In an embodiment, the first internal clock signal CLK_int1 may be changed from a logic low level to a logic high level in synchronization with a rising edge of the clock signal during the odd period.

During a period from t2 to t3, the internal clock generator 1111 may generate the second internal clock signal CLK_int2 in response to a falling edge of the clock signal. In an embodiment, the second internal clock signal CLK_int2 may be changed from a logic low level to a logic high level in synchronization with a falling edge of the clock signal during the odd period.

A period from t3 to t5 may be an even period EVEN. During the period from t3 to t5, the internal clock generator 1111 may generate the third internal clock signal CLK_int3 in response to a rising edge of the clock signal. In an embodiment, the third internal clock signal CLK_int3 may be changed from a logic low level to a logic high level in synchronization with a rising edge of the clock signal during the even period.

During a period from t4 to t5, the internal clock generator 1111 may generate the fourth internal clock signal CLK_int4 in response to a falling edge of the clock signal. In an embodiment, the fourth internal clock signal CLK_int4 may be changed from a logic low level to a logic high level in synchronization with a falling edge of the clock signal during the even period.

In an embodiment, the internal clock generator 1111 may generate the first to fourth internal clock signals CLK_int1 to CLK_int4, based on the rising edge and the falling edge of the clock signal during each of the odd period ODD and the even period EVEN. The data distributor 1112 may provide data received from the memory controller 2000 respectively to the first to fourth memory groups, based on the first to fourth internal clock signals CLK_int1 to CLK_int4. For example, the data distributor 1112 may provide first to fourth data sequentially received from the memory controller 2000 respectively to the first to fourth memory groups and then provide fifth to eighth data sequentially received from the memory controller 2000 respectively to the first to fourth memory groups, based on the first to fourth internal clock signals CLK_int1 to CLK_int4. First memory dies respectively included in the first to fourth memory groups may perform, in parallel, program operations of respectively storing the first to fourth data, and second memory dies respectively included in the first to fourth memory groups may perform, in parallel, program operations of respectively storing the fifth to eighth data.

Figure 6:
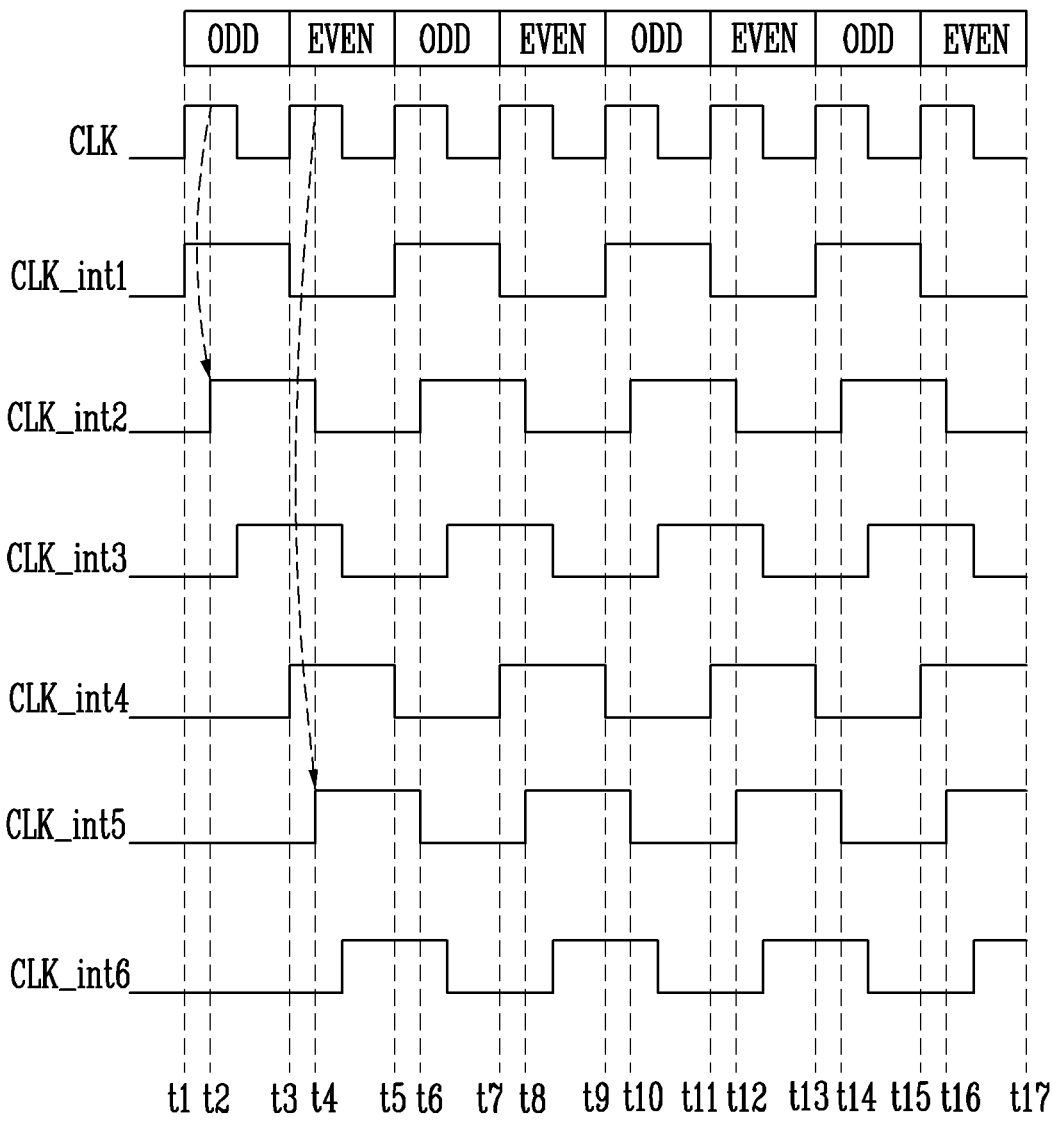
FIG. 6 is a timing diagram illustrating an operation of generating internal clock signals, based on a clock signal, in accordance with another embodiment of the present disclosure.

FIG. 6 is a timing diagram illustrating an operation of generating internal clock signals, based on a clock signal, in accordance with another embodiment of the present disclosure.

FIG. 6 is described with reference to FIG. 4. In FIG. 6, a case where the first memory package 1100 includes first to sixth memory groups (n=6) will be described as an example.

Referring to FIG. 6, the internal clock generator 1111 may generate first to sixth internal clock signals CLK_int1 to CLK_int6, based on the clock signal CLK received from the memory controller 2000. The first to sixth internal clock signals CLK_int1 to CLK_int6 may be clock signals to be respectively provided to first to sixth memory groups.

A period from t1 to t3 may be an odd period ODD. The internal clock generator 1111 may generate the first internal clock signal CLK_int1 in response to a rising edge of the clock signal during the odd period. The internal clock generator 1111 may sense a high level of the clock signal during the odd period clock signal, thereby generating the second internal clock signal CLK_int2. In an embodiment, the second internal clock signal CLK_int2 may be changed from a logic low level to a logic high level in synchronization with the high level of the clock signal during the odd period. The internal clock generator 1111 may generate the third internal clock signal CLK_int3 in response to a falling edge of the clock signal during the odd period.

A period from t3 to t5 may be an even period EVEN. The internal clock generator 1111 may generate the fourth internal clock signal CLK_int4 in response to a rising edge of the clock signal during the even period. The internal clock generator 1111 may sense a high level of the clock signal during the even period, thereby generating the fifth internal clock signal CLK_int5. In an embodiment, the fifth internal clock signal CLK_int5 may be changed from a logic low level to a logic high level in synchronization with the high level of the clock signal during the even period. The internal clock generator 1111 may generate the sixth internal clock signal CLK_int6 in response to a falling edge of the clock signal during the even period.

In an embodiment, the internal clock generator 1111 may generate the first to sixth internal clock signals CLK_int1 to CLK_int6, based on the rising edge and the falling edge of the clock signal during each of the odd period and the even period of the clock signal. The data distributor 1112 may distribute data received from the memory controller 2000 to the first to sixth memory groups, based on the first to sixth internal clock signals CLK_int1 to CLK_int6. For example, the data distributor 1112 may provide first to sixth data sequentially received from the memory controller 2000 respectively to the first to sixth memory groups and then provide seventh to twelfth data sequentially received from the memory controller 2000 respectively to the first to sixth memory groups, based on the first to sixth internal clock signals CLK_int1 to CLK_int6. First memory dies respectively included in the first to sixth memory groups may perform, in parallel, program operations of respectively storing the first to sixth data, and second memory dies respectively included in the first to sixth memory groups may perform, in parallel, program operations of respectively storing the seventh to twelfth data.

In another embodiment, the internal clock generator 1111 may sense a low level of the clock signal during the odd period, thereby generating a seventh internal clock signal. The internal clock generator 1111 may sense a low level of the clock signal during the even period, thereby generating an eighth internal clock signal. The first memory package 1100 shown in FIG. 4 may include first to eighth memory groups (n=8).

Figure 7:
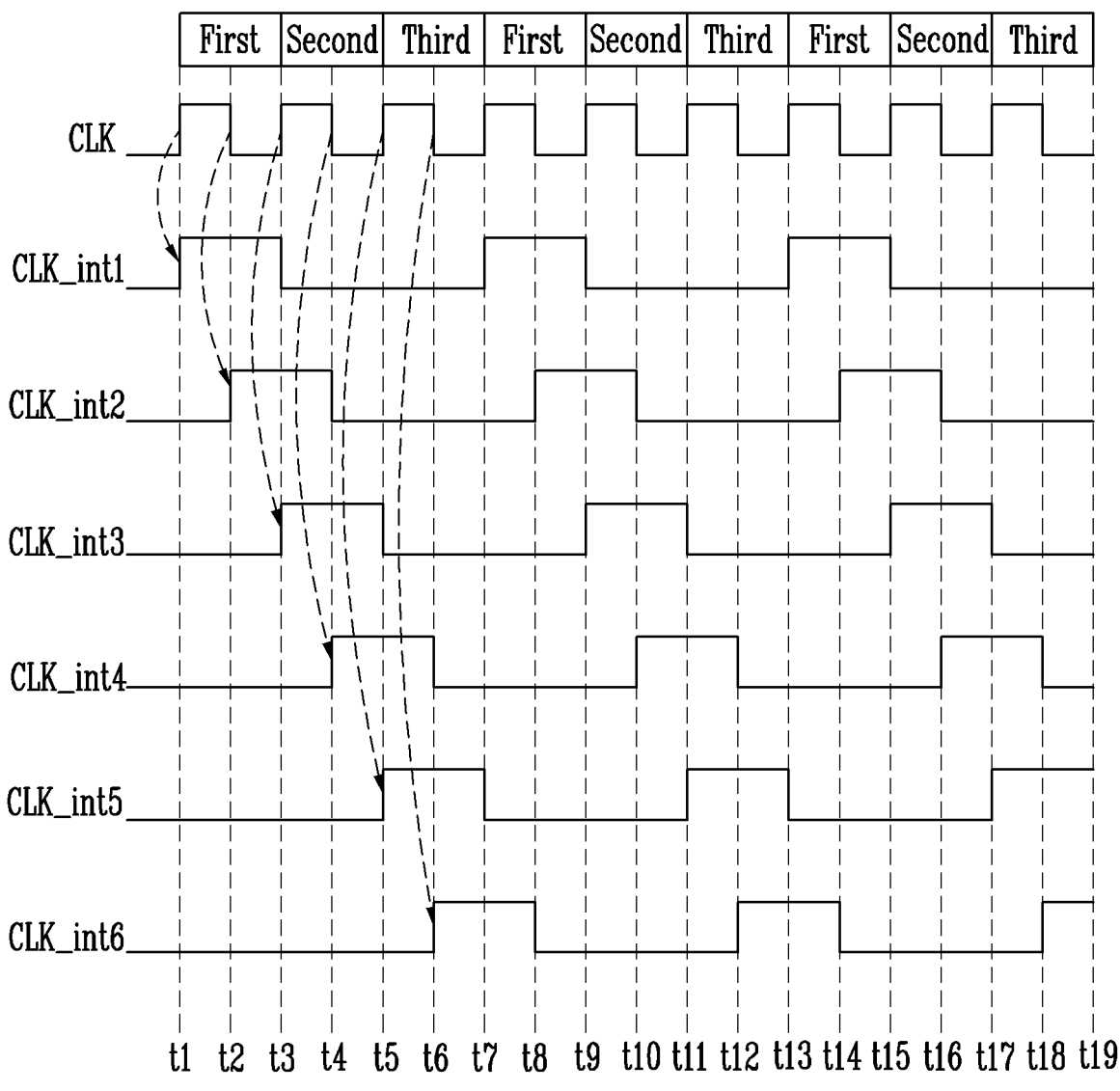
FIG. 7 is a timing diagram illustrating an operation of generating internal clock signals, based on a clock signal, in accordance with still another embodiment of the present disclosure.

FIG. 7 is a diagram illustrating an operation of generating internal clock signals, based on a clock signal, in accordance with still another embodiment of the present disclosure.

FIG. 7 is described with reference to FIG. 4. In FIG. 7, a case where the first memory package 1100 includes first to sixth memory groups (n=6) will be described as an example.

Referring to FIG. 7, the clock signal CLK may include a first period First, a second period Second, and a third period Third. The internal clock generator 1111 may generate first to sixth internal clock signals CLK_int1 to CLK_int6, based on the clock signal CLK received from the memory controller 2000. The first to sixth internal clock signals CLK_int1 to CLK_int6 may be clock signals to be respectively provided to first to sixth memory groups.

Specifically, a period from t1 to t3 may be the first period First. The internal clock generator 1111 may generate the first internal clock signal CLK_int1 in response to a rising edge of a clock signal during a first period. The internal clock generator 1111 may generate the second internal clock signal CLK_int2 in response to a falling edge of the clock signal during the first period.

A period from t3 to t5 may be the second period Second. The internal clock generator 1111 may generate the third internal clock signal CLK_int3 in response to a rising edge of a clock signal during a second period. The internal clock generator 1111 may generate the fourth internal clock signal CLK_int4 in response to a falling edge of the clock signal during the second period.

A period from t5 to t7 may be the third period Third. The internal clock generator 1111 may generate the fifth internal clock signal CLK_int5 in response to a rising edge of a clock signal during a third period. The internal clock generator 1111 may generate the sixth internal clock signal CLK_int6 in response to a falling edge of the clock signal during the third period.

In an embodiment, the internal clock generator 1111 may sense a high level of the clock signal during the first period, thereby generating a seventh internal clock signal. The internal clock generator 1111 may sense a high level of the clock signal during the second period, thereby generating an eighth internal clock signal. The internal clock generator 1111 may sense a high level of the clock signal during the third period, thereby generating a ninth internal clock signal.

In an embodiment, the internal clock generator 1111 may sense a low level of the clock signal during the first period, thereby generating a tenth internal clock signal. The internal clock generator 1111 may sense a low level of the clock signal during the second period, thereby generating an eleventh internal clock signal. The internal clock generator 1111 may sense a low level of the clock signal during the third period, thereby generating a twelfth internal clock signal.

In an embodiment, the internal clock generator 1111 may generate first to nth internal clock signals respectively corresponding to first to nth memory groups, based on the rising edge and the falling edge of the clock signal during each of a plurality of periods of the clock signal. The data distributor 1112 may provide data received from the memory controller 2000 respectively to the first to nth memory groups, based on the first to nth internal clock signals.

Figure 8:
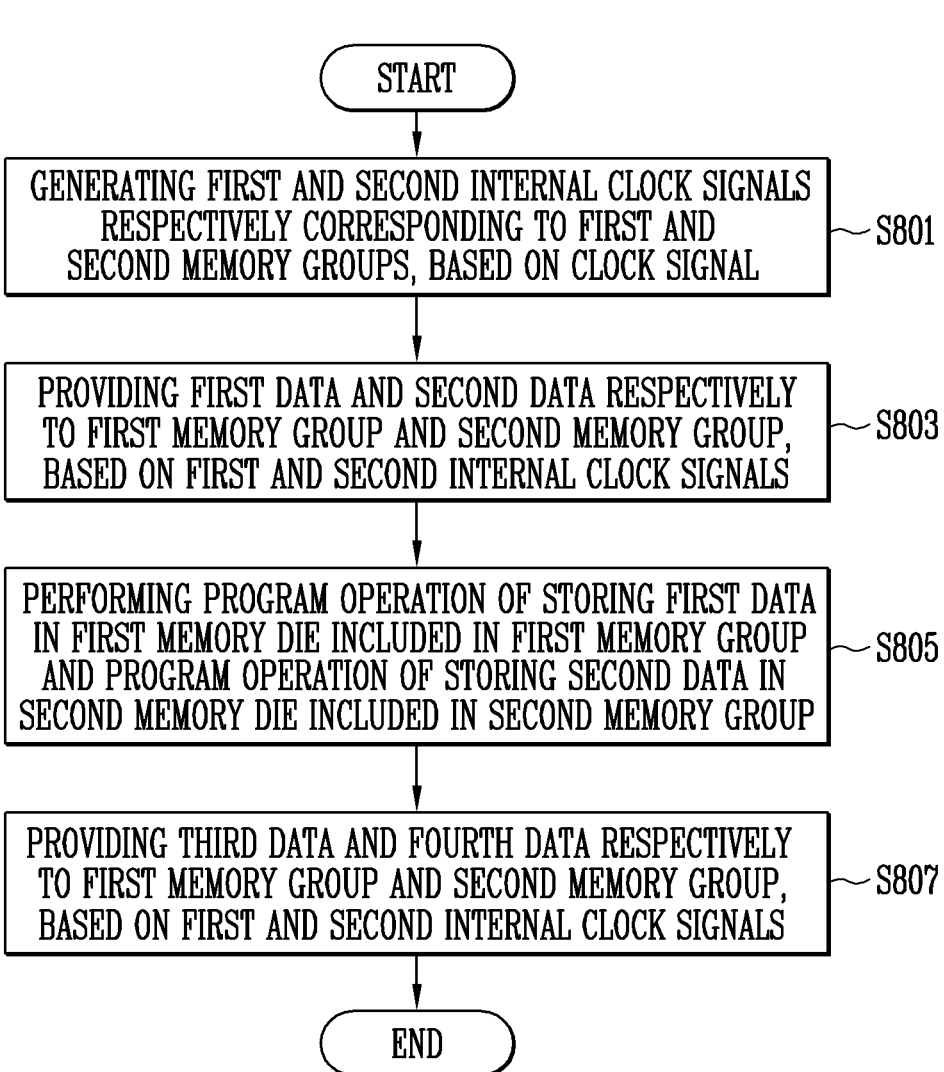
FIG. 8 is a flowchart illustrating an operation of processing data according to internal clock signals generated based on a clock signal in accordance with an embodiment of the present disclosure.

FIG. 8 is a flowchart illustrating an operation of processing data according to internal clock signals generated based on a clock signal in accordance with an embodiment of the present disclosure.

Referring to FIG. 8, in operation S801, the memory system 50 may generate first and second internal clock signals respectively corresponding to first and second memory groups, based on a clock signal. The memory system 50 may generate the first internal clock signal and the second internal clock signals in response to a rising edge of the clock signal during each of an odd period and an even period of the clock signal.

In operation S803, the memory system 50 may provide first data and second data respectively to the first memory group and the second memory group, based on the first and second internal clock signals. The first memory group and the second memory group may receive, in parallel, the first data and the second data.

In operation S805, the memory system 50 may perform a program operation of storing the first data in a first memory die included in the first memory group and a program operation of storing the second data in a second memory die included in the second memory group. The first memory die and the second memory die may perform, in parallel, the program operations.

In operation S807, the memory system 50 may provide third data and fourth data respectively to the first memory group and the second memory group, based on the first and second internal clock signals. A third memory die included in the first memory group and a fourth memory die included in the second memory group may perform, in parallel, program operations of respectively storing the third data and the fourth data.

Figure 9:
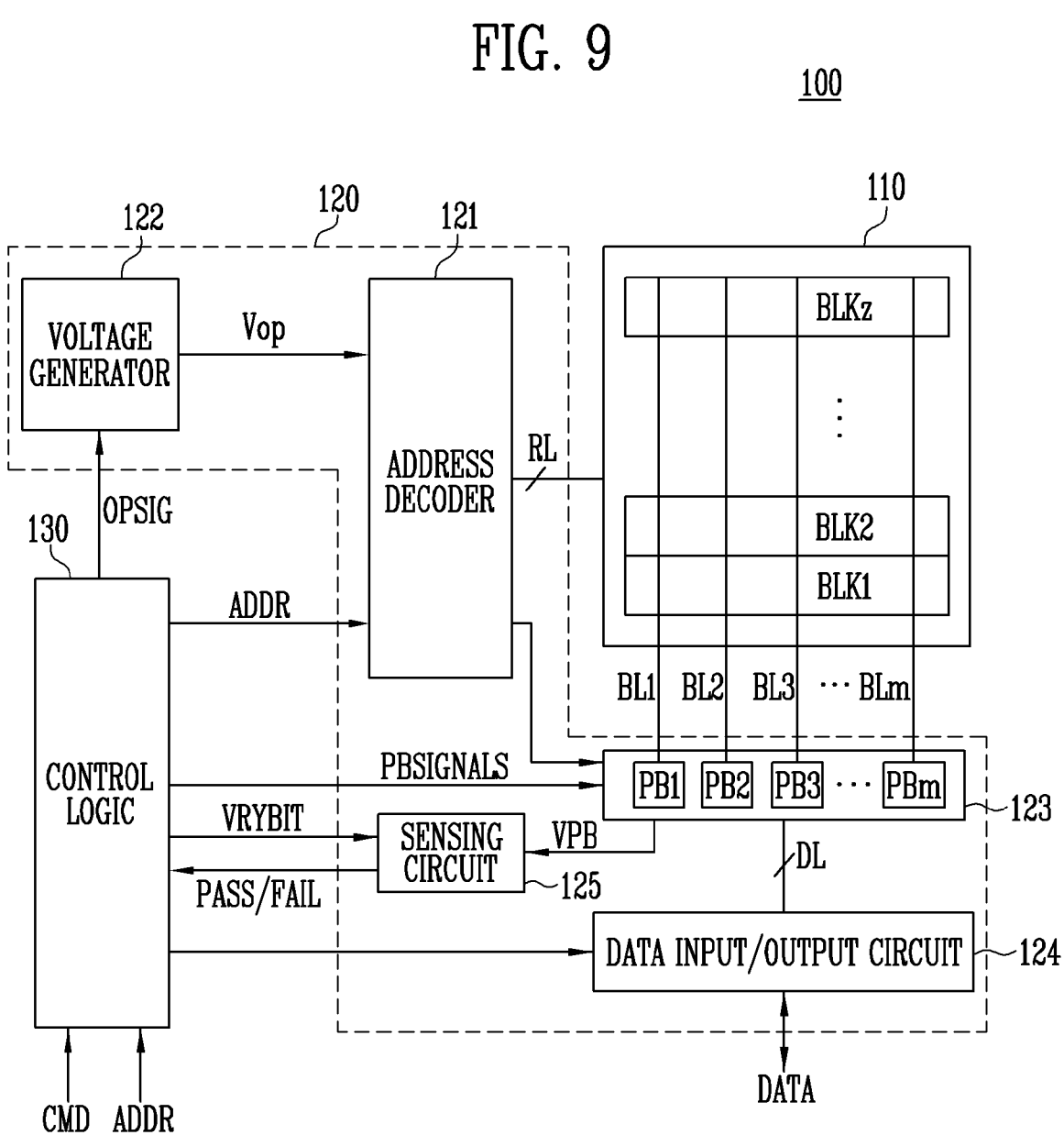
FIG. 9 is a diagram illustrating a memory die shown in FIG. 1 in accordance with an embodiment of the present disclosure.

FIG. 9 is a diagram illustrating a memory die 100 shown in FIG. 1 in accordance with still another embodiment of the present disclosure.

The memory die 100 shown in FIG. 9 may be any memory die among the plurality of memory dies included in the first and second memory groups 1120 and 1130 shown in FIG. 1.

The memory die 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells.

Each of the plurality of memory cells may be configured as a Single Level Cell (SLC) storing one-bit data, a Multi-Level Cell (MLC) storing two-bit data, a Triple Level Cell (TLC) storing three-bit data, a Quad Level Cell (QLC) storing four-bit data, or memory cells storing five-or-more-bit data.

The peripheral circuit 120 may drive the memory cell array 110. For example, the peripheral circuit 120 may drive the memory cell array 110 to perform a program operation, a read operation, and an erase operation under the control of the control logic 130. In another example, the peripheral circuit 120 may apply various operating voltages to the row lines RL and the bit lines BL1 to BLm or discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 may be connected to the memory cell array 110 through the row lines RL. The row lines RL may include drain select lines, a plurality of word lines, source select lines, and a common source line.

The address decoder 121 may be operated under the control of the control logic 130. The address decoder 121 may receive an address ADDR from the control logic 130.

The address decoder 121 may decode a block address in the received address ADDR. The address decoder 121 may select at least one memory block among the memory blocks BLK1 to BLKz according to the decoded block address. The address decoder 121 may select at least one word line of the selected memory block according to the decoded block address.

In a program operation, the address decoder 121 may apply a program voltage to the selected word line, and apply a pass voltage having a level less than a level of the program voltage to unselected word lines. In a program verify operation, the address decoder 121 may apply a verify voltage to the selected word line, and apply a verify pass voltage having a level greater than a level of the verify voltage to the unselected word lines.

The address decoder 121 may decode a column address in the received address ADDR. The decoded column address may be transferred to the page buffer group 123.

The voltage generator 122 may generate a plurality of operating voltages Vop by using an external power voltage supplied to the memory die 100. The voltage generator 122 may be operated under the control of the control logic 130.

In an embodiment, the voltage generator 122 may generate various operating voltages Vop used for program, read, and erase operations in response to an operation signal OPSIG. For example, the voltage generator 122 may generate a plurality of erase voltages, a plurality of program voltages, a plurality of pass voltages, a plurality of select read voltages, and a plurality of unselect read voltages. The plurality of operating voltages Vop may be supplied to the memory cell array 110 by the address decoder 121.

The page buffer group 123 may include first to mth page buffers PB1 to PBm. The first to mth page buffers PB1 to PBm may be connected to the memory cell array 110 respectively through first to mth bit lines BL1 to BLm. The first to mth page buffers PB1 to PBm may be operated under the control of the control logic 130.

The first to mth page buffers PB1 to PBm may communicate data DATA with the data input/output circuit 124. In a program operation, the first to mth page buffers PB1 to PBm may receive data DATA through the data input/output circuit 124 and data lines DL.

In a program operation, the first to mth page buffers PB1 to PBm may transfer data DATA received through the data input/output circuit 124 to selected memory cells through the bit lines BL1 to BLm. The selected memory cells may be programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a verify operation, the first to mth page buffers PB1 to PBm may read data DATA stored in the selected memory cells from the selected memory cells through the bit lines BL1 to BLm.

The data input/output circuit 124 may be connected to the first to mth page buffers PB1 to PBm through the data lines DL. The data input/output circuit 124 may be operated under the control of the control logic 130. In a program operation, the data input/output circuit 124 may receive data DATA from the memory controller 2000. The data input/output circuit 124 may receive the data DATA, based on a first internal clock signal CLK_int1 or a second internal clock signal CLK_int2, which the interface 1110 shown in FIG. 1 provides.

In a read operation or verify operation, the sensing circuit 125 may generate a reference current in response to an allow bit VRYBIT generated by the control logic 130, and output a pass or fail signal PASS/FAIL to the control logic 130 by comparing a sensing voltage VPB received from the page buffer group 123 with a reference voltage generated by the reference current. For example, the sensing circuit 125 may output the pass signal to the control logic 130 when a magnitude of the sensing voltage VPB is greater than a magnitude of the reference voltage. In another example, the sensing circuit 125 may output the fail signal to the control logic 130 when the magnitude of the sensing voltage VPB is less than the magnitude of the reference voltage.

The control logic 130 may be connected to the address decoder 121, the voltage generator 122, the page buffer group 123, the data input/output circuit 124, and the sensing circuit 125. The control logic 130 may control a general operation of the memory die 100. The control logic 130 may be operated in response to a command CMD transferred from the memory controller 2000.

The control logic 130 may control the peripheral circuit 120 by generating several signals in response to a command CMD and an address ADDR. For example, the control logic 130 may generate the operation signal OPSIG, the address ADDR, a page buffer control signal PBSIG, and the allow bit VRYBIT in response to the command CMD and the address ADDR. The control logic 130 may output the operation signal OPSIG to the voltage generator 122, output the address ADDR to the address decoder 121, output the page buffer control signal PBSIG to the page buffer group 123, and output the allow bit VRYBIT to the sensing circuit 125. Also, the control logic 130 may determine whether the verify operation has passed or failed in response to the pass or fail signal PASS/FAIL output by the sensing circuit 125.

Figure 10:
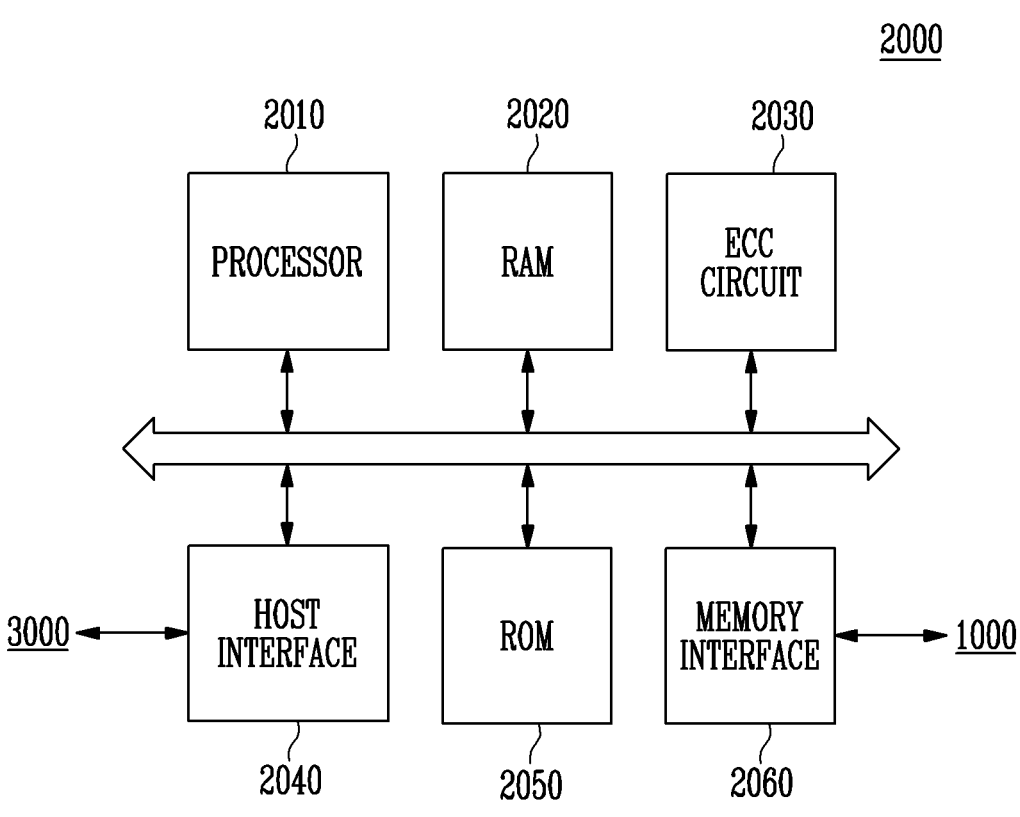
FIG. 10 is a diagram illustrating a memory controller shown in FIG. 1 in accordance with an embodiment of the present disclosure.

FIG. 10 is a diagram illustrating the memory controller 2000 shown in FIG. 1 in accordance with an embodiment of the present disclosure.

Referring to FIG. 10, the memory controller 2000 may include a processor 2010, a Random Access Memory (RAM) 2020, an Error Correction Code (ECC) circuit 2030, a host interface 2040, a Read Only Memory (ROM) 2050, and a memory interface 2060.

The processor 2010 may control a general operation of the memory controller 2000. The processor 2010 may control an operation of the memory controller 2000 to store data requested from the host 3000 in the memory device 1000. In an embodiment, the processor 2010 may control the memory device 1000 to store requests received from the host 3000 in the memory device 1000.

The RAM 2020 may be used as a buffer memory, a cache memory, a working memory, or the like of the memory controller 2000.

The ECC circuit 2030 may perform error correction. The ECC circuit 2030 may perform ECC encoding, based on data to be written in the memory device 1000 through the memory interface 2060. The ECC-encoded data may be transferred to the memory device 1000 through the memory interface 2060. The ECC circuit 2030 may perform ECC decoding on data received from the memory device 1000 through the memory interface 2060. In an embodiment, the ECC circuit 2030 may be included as a component of the memory interface 2060 in the memory interface 2060.

The ROM 2050 may store, in a firmware form, various information required when the memory controller 1000 is operated.

The memory controller 2000 may communicate with an external device (e.g., the host 3000, an application processor, or the like) through the host interface 2040. The memory controller 2000 may receive data provided through the host interface 2040.

The memory controller 2000 may communicate with the memory device 1000 through the memory interface 2060. The memory controller 2000 may transmit a command, an address, a control signal, and the like to the memory device 1000 through the memory interface 2060, and receive data. In an embodiment, the memory interface 2060 may communicate with the memory device 1000 through a plurality of channels. One channel may be connected to at least one memory package. The memory interface 2060 may provide data to the memory device 1000, based on a clock signal.

In accordance with the present disclosure, there can be provided a memory device including a memory package and a memory system including the memory device, which can increase the speed at which data received from the outside is processed.

While the present disclosure has been shown and described with reference to various embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. Furthermore, the embodiments may be combined to form additional embodiments.

What is claimed is:

1. A memory system comprising:
a memory device; and
a memory controller configured to provide data to the memory device based on a clock signal,
wherein the memory device includes:
a first memory group;
a second memory group;
an internal clock generator configured to generate a first internal clock signal and a second internal clock signal based on the clock signal, wherein each of the first and second internal clock signals has a period longer than a period of the clock signal, and the first and second internal signals have different phases; and
a data distributor configured to provide the data respectively to the first memory group and the second memory group, based on the first internal clock signal and the second internal clock signal,
wherein the data includes a first data item and a second data item,
wherein the data distributor provides the first data item and the second data item respectively to a first memory die included in the first memory group and a second memory die included in the second memory group, based on the first internal clock signal and the second internal clock signal, and
wherein the first memory die and the second memory die perform, in parallel, program operations of respectively storing the first data item and second data item.

2. The memory system of claim 1, wherein the first and second memory groups receive the data from the memory controller through the same channel.

3. The memory system of claim 1,
wherein the data further includes a third data item and a fourth data item, and
wherein the data distributor provides the first data item and the second data item respectively to the first memory die and the second memory die, and then provides the third data item and the fourth data item respectively to a third memory die included in the first memory group and a fourth memory die included in the second memory group, based on the first internal clock signal and the second internal clock signal.

4. The memory system of claim 1, wherein the first internal clock signal and the second internal clock signal are generated in response to a set edge of the clock signal during different periods of the clock signal.

5. The memory system of claim 1,
wherein the memory device includes a plurality of memory packages, and wherein the first memory group and the second memory group are memory groups included in a memory package among the plurality of memory packages.

6. The memory system of claim 1,
wherein the data includes multiple data items, and
wherein the data distributor provides one or more data items to the first memory group, based on the first internal clock signal, and provides one or more data items to the second memory group, based on the second internal clock signal.

7. The memory system of claim 1, wherein a speed at which the data are received from the memory controller based on the clock signal is faster than a speed at which the data are provided to the first or second memory group, based on the first or second internal clock signal.

8. The memory system of claim 1, wherein at least the first internal clock changes from a logic low level to a logic high level and from the logic high level to the logic low level in synchronization with rising edges of the clock signal.

9. A memory system comprising:
a memory device; and
a memory controller configured to provide data to the memory device based on a clock signal,
wherein the memory device includes:
first to nth memory groups each including a plurality of memory dies;
an internal clock generator configured to generate first to nth internal clock signals based on the clock signal, wherein each of the first to nth internal clock signals has a period longer than a period of the clock signal, and the first to nth internal signals have different phases; and
a data distributor configured to provide the data to the first to nth memory groups, respectively, based on the first to nth internal clock signals,
wherein the data distributor provides the data to first memory dies in each of the first to nth memory groups, respectively, based on the first to nth internal clock signals, and
wherein the first memory dies respectively included in the first to nth memory groups simultaneously perform a program operation of storing the data.

10. The memory system of claim 9, wherein the internal clock generator generates the first to nth internal clock signals, based on a rising edge, a falling edge, or a level of the clock signal during each of different periods included in the clock signal.

11. The memory system of claim 9,
wherein the memory device includes a plurality of memory packages, and
wherein the first to nth memory groups are included in a memory package among the plurality of memory packages.

12. The memory system of claim 11, wherein the plurality of memory packages communicate with the memory controller respectively through different channels.

13. The memory system of claim 9, wherein at least the first internal clock changes from a logic low level to a logic high level and from the logic high level to the logic low level in synchronization with rising edges of the clock signal.

14. A memory package comprising:
first to nth memory groups each including a plurality of memory dies;
an internal clock generator configured to generate first to nth internal clock signals based on a clock signal, and provide the first to nth internal clock signals to the first to nth memory groups, respectively, wherein each of the first to nth internal clock signals has a period longer than a period of the clock signal, and the first to nth internal signals have different phases; and a data distributor configured to receive data according to the clock signal, and distribute the data to the first to nth memory groups, respectively, based on the first to nth internal clock signals, wherein the data includes first to nth data items, wherein the data distributor distributes the first to nth data items to first memory dies in each of the first to nth memory groups, respectively, based on the first to nth internal clock signals, and wherein the first memory dies in each of the first to nth memory groups perform, in parallel, program operations of respectively storing the first to nth data items.

15. The memory package of claim 14, wherein the internal clock generator generates the first to nth internal clock signals, based on a rising edge, a falling edge, or a level of the clock signal during each of different periods included in the clock signal.

16. The memory package of claim 14, wherein the data includes first to 2n-th data items, and wherein the data distributor distributes the first to n-th data items to the first to nth memory groups, respectively, and then distributes the (n+1)-th to 2n-th data items to the first to nth memory groups, respectively, based on the first to nth internal clock signals.

17. The memory package of claim 14, wherein at least the first internal clock changes from a logic low level to a logic high level and from the logic high level to the logic low level in synchronization with rising edges of the clock signal.

* * * * *